(12) United States Patent
Nam et al.

(10) Patent No.: US 9,653,572 B2
(45) Date of Patent: May 16, 2017

(54) METHOD FOR FABRICATING SEMICONDUCTOR DEVICE

(71) Applicant: SAMSUNG ELECTRONICS CO., LTD., Suwon-si, Gyeonggi-Do (KR)

(72) Inventors: Seon-Ah Nam, Seoul (KR); Sung-Hoon Kim, Hwaseong-si (KR); Il-Ryong Kim, Seongnam-si (KR); Kwang-You Seo, Suwon-si (KR); Kwang-Yong Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 30 days.

(21) Appl. No.: 14/806,304

(22) Filed: Jul. 22, 2015

(65) Prior Publication Data

US 2016/0225876 A1 Aug. 4, 2016

(30) Foreign Application Priority Data

Jan. 30, 2015 (KR) ........................ 10-2015-0014955

(51) Int. Cl.
*H01L 21/3213* (2006.01)
*H01L 29/66* (2006.01)
*H01L 21/321* (2006.01)
*H01L 29/51* (2006.01)
*H01L 29/78* (2006.01)
*H01L 29/165* (2006.01)

(52) U.S. Cl.
CPC .. *H01L 29/66545* (2013.01); *H01L 21/32134* (2013.01); *H01L 21/32139* (2013.01); *H01L 29/66553* (2013.01); *H01L 29/66636* (2013.01); *H01L 29/66795* (2013.01); *H01L 21/32105* (2013.01); *H01L 29/165* (2013.01); *H01L 29/513* (2013.01); *H01L 29/517* (2013.01); *H01L 29/7848* (2013.01)

(58) Field of Classification Search
None
See application file for complete search history.

(56) References Cited

U.S. PATENT DOCUMENTS

| 8,466,502 | B2 * | 6/2013 | Tsai | ............... | H01L 21/823807 |
| | | | | | 257/274 |
| 8,492,812 | B2 | 7/2013 | Hwang | | |
| 8,592,271 | B2 * | 11/2013 | Tsai | ............... | H01L 21/823807 |
| | | | | | 257/374 |

(Continued)

FOREIGN PATENT DOCUMENTS

| JP | 2002-118259 | 4/2002 |
| JP | 4093712 | 3/2008 |

(Continued)

*Primary Examiner* — Lex Malsawma
(74) *Attorney, Agent, or Firm* — Volentine & Whitt, PLLC

(57) ABSTRACT

A method of fabricating a semiconductor device includes forming a dummy gate on a substrate, forming a dummy gate mask on the dummy gate, forming a gate spacer on the substrate, the gate spacer covering at least one sidewall surface of the dummy gate and the dummy gate mask, forming a recess on at least one side of the dummy gate by etching the substrate, and forming an epitaxial layer in the recess using an epitaxial growth process. The forming of the dummy gate mask includes forming an oxide layer and a dummy gate mask layer on the dummy gate.

16 Claims, 16 Drawing Sheets

(56) References Cited

U.S. PATENT DOCUMENTS

| | | | |
|---|---|---|---|
| 8,680,610 B2 | 3/2014 | Hsieh | |
| 8,685,847 B2 * | 4/2014 | Majumdar | ........ H01L 29/66545 |
| | | | 257/347 |
| 8,809,173 B1 | 8/2014 | Yin et al. | |
| 8,828,813 B2 | 9/2014 | Huang et al. | |
| 9,076,817 B2 * | 7/2015 | Pei | ...................... H01L 29/6656 |
| 2008/0283906 A1 * | 11/2008 | Bohr | ...................... H01L 29/045 |
| | | | 257/327 |
| 2012/0104498 A1 * | 5/2012 | Majumdar | ........ H01L 29/66545 |
| | | | 257/351 |
| 2014/0322872 A1 | 10/2014 | Wang et al. | |

FOREIGN PATENT DOCUMENTS

| | | |
|---|---|---|
| JP | 2009-158677 | 7/2009 |
| KR | 0579845 | 5/2006 |
| KR | 0643571 | 11/2006 |
| KR | 2009-0123692 A | 12/2009 |
| KR | 0935773 | 12/2009 |
| KR | 0948298 | 3/2010 |
| KR | 0960444 | 5/2010 |
| KR | 2011-0078101 A | 7/2011 |
| KR | 1095739 B1 | 12/2011 |

* cited by examiner

METHOD FOR FABRICATING SEMICONDUCTOR DEVICE

CROSS-REFERENCE TO RELATED APPLICATION

A claim of priority under 35 U.S.C. §119 is made to Korean Patent Application No. 10-2015-0014955 filed on Jan. 30, 2015 in the Korean Intellectual Property Office, the contents of which are herein incorporated by reference in their entirety.

BACKGROUND

The present disclosure relates to a method for fabricating a semiconductor device, and more particularly, to a method for fabricating a semiconductor device that includes an oxide layer positioned over a dummy gate.

In semiconductor technologies, there are continuing trends of increasing device integration and scaling down device sizes. This has been coupled with an increasing demand for faster and more reliable devices, creating significant challenges in realizing improved device design and device fabrication techniques. One resultant area of study is directed to the optimization of transistors to allow semiconductor devices to operate quickly while securing process reliability.

SUMMARY

According to an aspect of the present disclosure, there is provided a method for fabricating a semiconductor device, the method including forming a dummy gate on a substrate, forming a dummy gate mask on the dummy gate, forming a gate spacer on the substrate, the gate spacer covering at least one sidewall surface of the dummy gate and the dummy gate mask, forming a recess on at least one side of the dummy gate by etching the substrate, and forming an epitaxial layer in the recess using an epitaxial growth process, wherein the forming of the dummy gate mask comprises forming an oxide layer and a dummy gate mask layer on the dummy gate.

According to another aspect of the present disclosure, there is provided a method for fabricating a semiconductor device, the method including preparing a substrate including a first region and a second region, sequentially stacking a first dummy gate, an interlayer oxide layer, and a first dummy gate mask on the first region, sequentially stacking a second dummy gate and a second dummy gate mask on the second region, forming a dummy gate oxide layer on at least one of the first dummy gate and the second dummy gate, forming a first gate spacer covering at least first side surfaces of the first on dummy gate, the interlayer oxide layer and the first dummy gate mask on the first region, forming a second gate spacer covering at least first side surfaces of the second dummy gate and the second dummy gate mask, forming a recess on at least one side of the first dummy gate and the second dummy gate by etching the substrate, and forming an epitaxial layer in the recess through epitaxial growth.

According to still another aspect of the present disclosure, there is provided a method for fabricating a semiconductor device, the method including forming a dummy gate on a substrate, forming an interlayer oxide layer on the dummy gate, forming a dummy gate mask on the interlayer oxide layer, forming a gate spacer layer covering the substrate, forming a gate space on sidewalls of the dummy gate, the interlayer oxide layer and the dummy gate mask by removing a portion of the gate spacer layer formed on the substrate, forming a recess by etching the substrate of at least one side of the dummy gate, forming an epitaxial layer in the recess through epitaxial growth, forming an interlayer insulation layer covering the epitaxial layer and the gate spacer, performing a planarization process to expose the dummy gate, and removing the dummy gate and then forming an upwardly extending gate insulation layer on a region from which the dummy gate is removed along sidewalls of the gate spacer and forming a gate electrode on the gate insulation layer.

BRIEF DESCRIPTION OF THE DRAWINGS

The above and other features and aspects of the present disclosure will become apparent from the detailed description that follows, with reference to the accompanying drawings, in which.

DETAILED DESCRIPTION OF THE EMBODIMENTS

Figure 1:
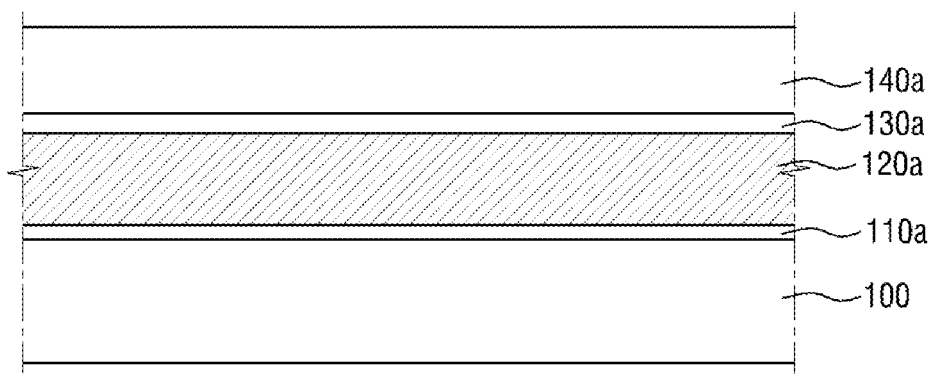
FIGS. 1 to 12 are cross-sectional views for reference in describing a method for fabricating a semiconductor device according to an embodiment of the present disclosure.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Along with the development of semiconductor technology, semiconductor devices are gradually being miniaturized. Therefore, as the semiconductor devices are downsized, various types of defects may be generated due to an insufficient margin of a gate spacer disposed on side surfaces of a dummy gate at the time of fabricating the semiconductor device. The defects may include, for example, a nodule defect. To avoid such defects, there is a demand for methods for fabricating a semiconductor device, which can be performed in a reliable manner by securing a sufficient margin of a gate spacer.

Hereinafter, methods for fabricating semiconductor devices according to embodiments of the present disclosure will now be described with reference to the accompanying drawings.

FIGS. 1 to 12 are cross-sectional views for reference in describing a method for fabricating a semiconductor device according to a first embodiment of the present disclosure.

Referring to FIG. 1, a dummy gate insulation layer 110a, a dummy gate layer 120a, an interlayer oxide layer 130a and a dummy gate mask layer 140a are sequentially stacked on a substrate 100.

The substrate 100 may include at least one of semiconductor materials selected from the silicon (Si) containing group consisting of, for example, Si, SiGe, SiC, and SiGeC, but aspects of the present disclosure are not limited thereto. Therefore, the substrate 100 may be a silicon on insulator (SOI) substrate, a gallium arsenic substrate, a ceramic substrate, a quartz substrate, a rigid substrate such as a glass substrate for display, or a flexible plastic substrate made of polymethyl methacrylate, polycarbonate, polyether sulfone, polyimide, polyethylene terephthalate or polyethylene naphthalate.

Although not shown, a device isolation layer may be formed on the substrate 100 to define an active region. The device isolation layer may be a field oxide (FOX) or a shallow trench isolation (STI) using a LOCOS (LOCal Oxidation of Silicon) process.

The substrate 100 may include a PMOS region. That is to say, a PMOS transistor may be formed on the substrate 100, but aspects of the present disclosure are not limited thereto. The substrate 100 may include an NMOS region.

A dummy gate insulation layer 110a may be formed on the substrate 100. The dummy gate insulation layer 110a may be formed by, for example, chemical vapor deposition (CVD), physical vapor deposition (PVD) or atomic layer deposition (ALD). Meanwhile, since the dummy gate insulation layer 110a may be removed when a dummy gate (120 of FIG. 2) is removed in a subsequent process, it may be made of the same material with the dummy gate layer 120a or a material having the same etching selectivity with the dummy gate layer 120a.

Next, the dummy gate layer 120a may be formed on the dummy gate insulation layer 110a. The dummy gate layer 120a may be a single layer made of poly-Si, poly-SiGe, doped poly-Si, a metal such as Ta, TaN, TaSiN, TiN, Mo, Ru, Ni or NiSi, or metal silicide, or a stacked layer of a combination of these materials, but aspects of the present disclosure are not limited thereto. The dummy gate layer 120a may be formed by, for example, chemical vapor deposition (CVD), physical vapor deposition (PVD) or atomic layer deposition (ALD), but aspects of the present disclosure are not limited thereto.

The interlayer oxide layer 130a may be formed on the dummy gate layer 120a. The interlayer oxide layer 130a may be a non-metal oxide layer, for example, a silicon oxide layer. However, the interlayer oxide layer (130 of FIG. 2) needs to be etched better than the dummy gate (120 of FIG. 2) and the dummy gate mask (140 of FIG. 2) in a subsequent process. Therefore, the interlayer oxide layer 130a may be formed of a material having higher etching selectivity than the dummy gate layer 120a and the dummy gate mask layer 140a with respect to the same etchant.

The interlayer oxide layer 130a may be formed by, for example, chemical vapor deposition (CVD), physical vapor deposition (PVD) or atomic layer deposition (ALD), but aspects of the present disclosure are not limited thereto.

The dummy gate mask layer 140a may be formed on the interlayer oxide layer 130a. The dummy gate mask layer 140a may include a silicon oxide or a silicon nitride, but aspects of the present disclosure are not limited thereto. The dummy gate layer 120a and the interlayer oxide layer 130a may be protected by the dummy gate mask layer 140a.

Figure 2:
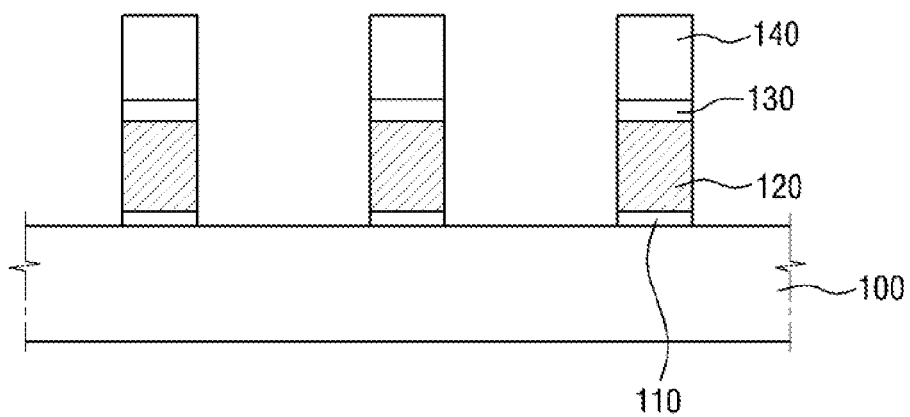

Next, referring to FIG. 2, the dummy gate insulation layer 110a, the dummy gate layer 120a, the interlayer oxide layer 130a and the dummy gate mask layer 140a are patterned, thereby forming the dummy gate insulation layer 110, the dummy gate 120, the interlayer oxide layer 130 and the dummy gate mask 140.

In the present embodiment, since the interlayer oxide layer 130 is formed between the dummy gate 120 and the dummy gate mask 140, creation of a defect can be prevented, thereby improving the process reliability, which will later be described.

Figure 3:
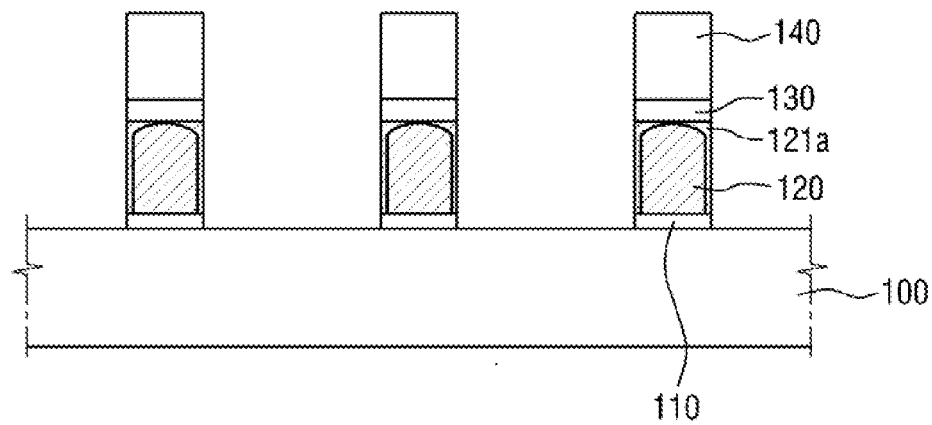

Next, referring to FIG. 3, a dummy gate oxide layer 121a is formed on top and side surfaces of the dummy gate 120.

The dummy gate oxide layer 121a may be formed on the top surface of the dummy gate 120 in part or whole. In addition, the dummy gate oxide layer 121a may be formed on may be formed on side surfaces of the dummy gate 120 in part or whole. In the present embodiment, the dummy gate oxide layer 121a formed on the top surface of the dummy gate 120 in part and on the side surfaces of the dummy gate 120 in whole is illustrated, but aspects of the present disclosure are not limited thereto.

The dummy gate oxide layer 121a may be formed by an oxidation process, for example, thermal oxidation. That is to say, portions of the top and side surfaces of the dummy gate 120 may be oxidized by thermal oxidation to then turn into a dummy gate oxide layer 121a. In detail, when the dummy gate 120 includes poly-Si, the top and side surfaces of the dummy gate 120 may become the dummy gate oxide layer 121a that is a poly-Si oxide layer. The dummy gate oxide layer 121a may be formed by an oxidation process, for example, thermal oxidation. That is to say, surfaces of the top and side surfaces of the dummy gate 120 may be oxidized by thermal oxidation to then turn into a dummy gate oxide layer 121a. In detail, when the dummy gate 120 includes poly-Si, the top and side surfaces of the dummy gate 120 may become the dummy gate oxide layer 121a that is a poly-Si oxide layer.

Figure 4:
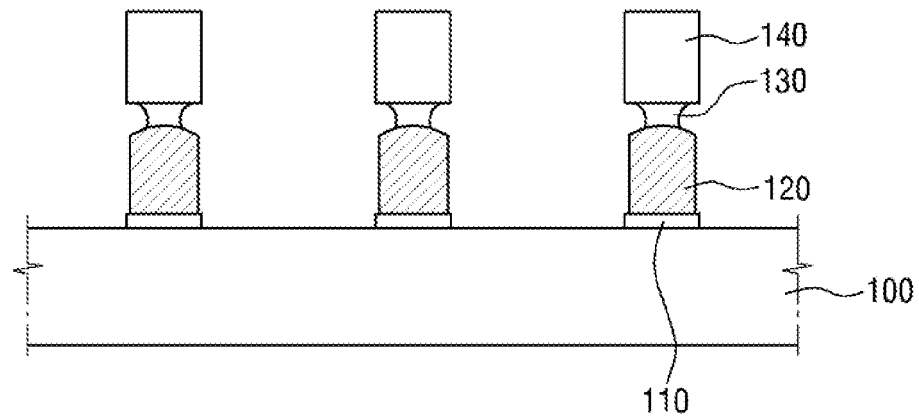

Next, referring to FIG. 4, the dummy gate oxide layer 121a and a portion of the side surfaces of the interlayer oxide layer 130 are removed.

As the result of removing the dummy gate oxide layer 121a, at least a portion of the dummy gate 120 may be exposed. Compared to the dummy gate 120 according to the embodiment illustrated in FIG. 2, the dummy gate 120 according to the embodiment illustrated in FIG. 4 may have a reduced overall size in view of volume or width.

Since portions of the side surfaces of the interlayer oxide layer 130 are removed, the interlayer oxide layer 130 may be positioned inside the dummy gate 120 and the dummy gate mask 140. That is to say, a width of the interlayer oxide layer 130 may be smaller than a width of the dummy gate 120 and/or a width of the dummy gate mask 140. The dummy gate 120 may also be positioned inside the dummy gate mask 140 disposed thereon. That is to say, the width of the dummy gate 120 may be smaller than that of the dummy gate mask 140.

That is to say, in a case where the dummy gate 120, the interlayer oxide layer 130 and the dummy gate mask 140 constitute a dummy structure, a concave portion may be observed from a position at which the interlayer oxide layer 130 is disposed when viewing a side surface of the dummy structure.

In the present embodiment, the portion of the interlayer oxide layer 130 and the dummy gate oxide layer 121a are removed, but aspects of the present disclosure are not limited thereto. That is to say, the portion of the interlayer oxide layer 130 and the dummy gate oxide layer 121a may not be removed. Even in this case, the interlayer oxide layer 130 and the dummy gate oxide layer 121a may prevent a nodule defect of the dummy gate 120 from being generated.

The portion of the interlayer oxide layer 130 and the dummy gate oxide layer 121a may be removed by wet etching using etching selectivity. Therefore, the dummy gate oxide layer 121a and the interlayer oxide layer 130 may be made of materials having higher etching selectivity than the dummy gate 120 and the dummy gate mask 140. As the etchant used in the wet etching, any kind of etchant can be used without limitation so long as it satisfies the above-described etching selectivity requirement. In addition, removing extents of the dummy gate oxide layer 121a and the interlayer oxide layer 130 can be adjusted by controlling a wet etching time.

Figure 5:
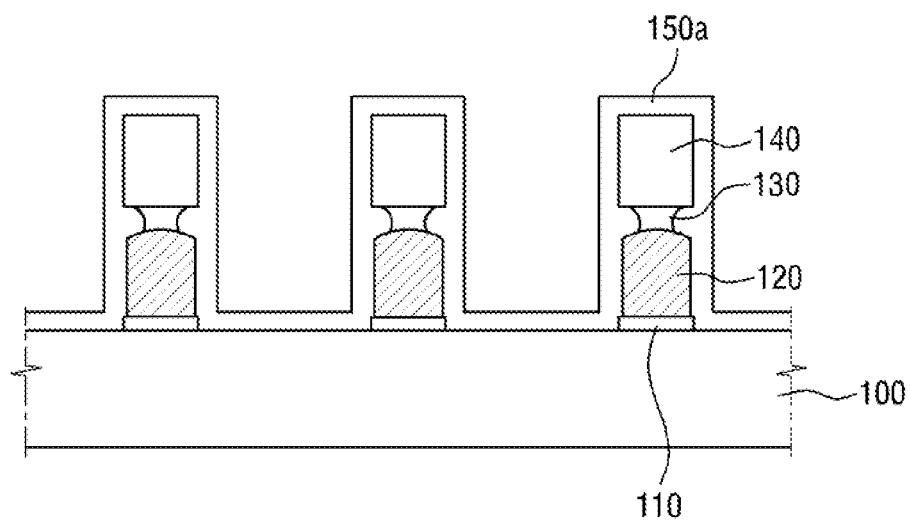

Next, referring to FIG. 5, a gate spacer layer 150a is formed on the substrate 100.

The gate spacer layer 150a may be conformally formed along the exposed top surface of the substrate 100, side surfaces of the dummy gate insulation layer 110, the dummy gate 120 and the interlayer oxide layer 130, and side and top surfaces of the dummy gate mask 140. In the present embodiment, the gate spacer layer 150a having planar side surfaces is illustrated, but aspects of the present disclosure are not limited thereto. Therefore, the side surfaces of the gate spacer layer 150a may have concave portions at regions corresponding to a top end of the dummy gate 120 and the interlayer oxide layer 130.

In the present embodiment, the gate spacer layer 150a is illustrated as a single layer, but aspects of the present disclosure are not limited thereto. That is to say, the gate spacer layer 150a may include a plurality of layers, which will later be described through another embodiment of the present disclosure.

The gate spacer layer 150a may include an oxide, such as a silicon oxide, or a nitride, such a silicon nitride, but aspects of the present disclosure are not limited thereto. The gate spacer layer 150a may be formed by, for example, chemical vapor deposition (CVD), physical vapor deposition (PVD) or atomic layer deposition (ALD), but aspects of the present disclosure are not limited thereto.

Figure 6:
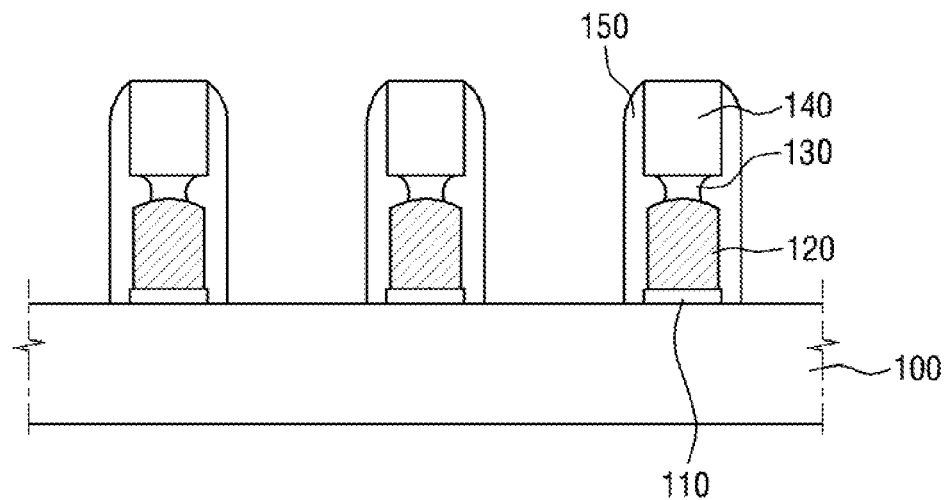

Next, referring to FIG. 6, the gate spacer layer 150a is removed from the top surface of the substrate 100 and the top surface of the dummy gate mask 140, thereby forming a gate spacer 150.

To form the gate spacer 150, an etch back process, for example, may be used, but aspects of the present disclosure are not limited thereto. In the present embodiment, a portion of the gate spacer layer 150a disposed on the top surface of the dummy gate mask 140 is removed, but aspects of the present disclosure are not limited thereto. That is to say, the gate spacer layer 150a disposed on the top surface of the dummy gate mask 140 may not be completely removed but may remain. Thus, the top surface of the dummy gate mask 140 may not be completely exposed. However, the gate spacer layer 150a disposed on the top surface of the substrate 100 is removed, thereby exposing the top surface of the substrate 100.

According to the present embodiment, the interlayer oxide layer 130 having partially removed portions of its side surfaces is interposed between the dummy gate 120 and the dummy gate mask 140 having larger widths than the interlayer oxide layer 130. Therefore, the gate spacer 150 may have different widths according to the configuration of a component disposed on the side surface of the gate spacer 150. That is to say, a region of the interlayer oxide layer 130 disposed on the side surface of the gate spacer 150 may have a larger thickness than the other region of the interlayer oxide layer 130.

Figure 7:
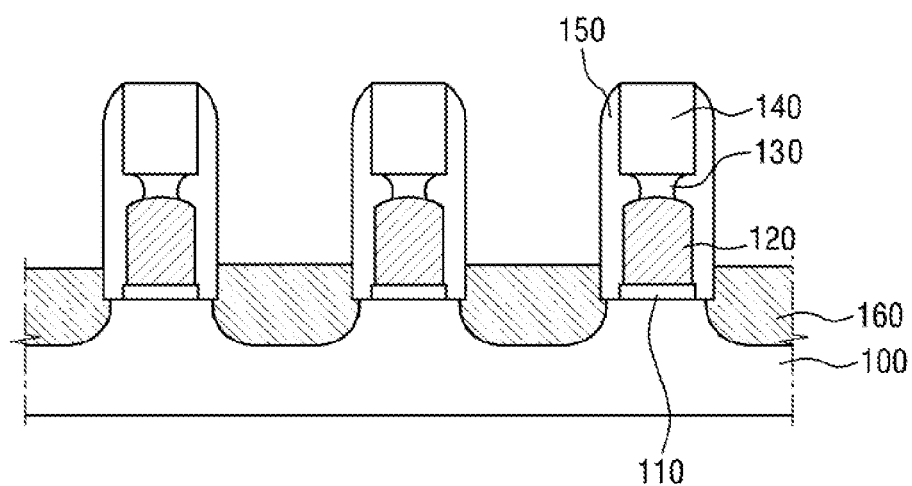

Next, referring to FIG. 7, an epitaxial layer 160 is formed on the substrate 100 of one side of the gate spacer 150.

The epitaxial layer 160 may be formed by forming a recess by etching the substrate of a corresponding region and then performing epitaxial growth in the recess.

The epitaxial layer 160 may become a source/drain region. For example, referring back to FIG. 7, the epitaxial layer 160 formed in the right side of the centrally positioned dummy gate 120 may be a source region and the epitaxial layer 160 formed in the left side of the centrally positioned dummy gate 120 may be a drain region, but aspects of the present disclosure are not limited thereto. When the substrate 100 is a PMOS region, the epitaxial layer 160 may include a compressive stress material. For example, the compressive stress material may be a material having a larger lattice constant than Si, e.g., SiGe. The compressive stress material may improve the mobility of carriers of a channel region by applying compressive stress to the substrate 100 between opposite sides of the epitaxial layer 160, that is, the channel region.

Meanwhile, when the substrate 100 is an NMOS region, the epitaxial layer 160 may include the same material as the substrate 100 or a tensile stress material. For example, when the substrate 100 includes Si, the epitaxial layer 160 may include a material having a smaller lattice constant than Si (e.g., SiC).

Meanwhile, during epitaxial growth of the epitaxial layer 160, if the gate spacer 150 covering sidewalls of the dummy gate 120 is not sufficiently thick, the epitaxial growth may also be performed on the dummy gate 120. In detail, when the dummy gate 120 includes poly-Si, it may have a crystal plane, like a single crystalline Silicon. As described above, a semiconductor epitaxial layer formed to be parasitic on the dummy gate 120 may cause a nodule defect. The nodule defect may lower operation performance of a semiconductor device and a processing yield of the semiconductor device. Therefore, it is necessary to cover sufficiently thickly the dummy gate 120 to prevent the dummy gate 120 from being exposed during epitaxial growth.

In the present embodiment, the interlayer oxide layer 130 is formed to form concave portions between the dummy gate 120 and the dummy gate mask 140. In addition, since the gate spacer 150 is formed along side surfaces of the dummy gate 120, the interlayer oxide layer 130 and the dummy gate mask 140, as described above through the embodiment illustrated in FIG. 7, a portion of the gate spacer 150 disposed on the side surface of the interlayer oxide layer 130 is thicker than the other portion. In addition, the sufficiently thick gate spacer 150 can be formed on the top and side surfaces of the dummy gate 120 by removing the dummy gate oxide layer 121a. Accordingly, during epitaxial growth for forming the epitaxial layer 160, a nodule defect, which may be formed on the top or side surface, particularly the top surface, of the dummy gate 120, can be prevented from being generated by forming the sufficiently thick gate spacer 150. In this case, the gate spacer 150 may serve as a dummy gate protection layer. Accordingly, the process reliability of the semiconductor device can be improved.

Figure 8:
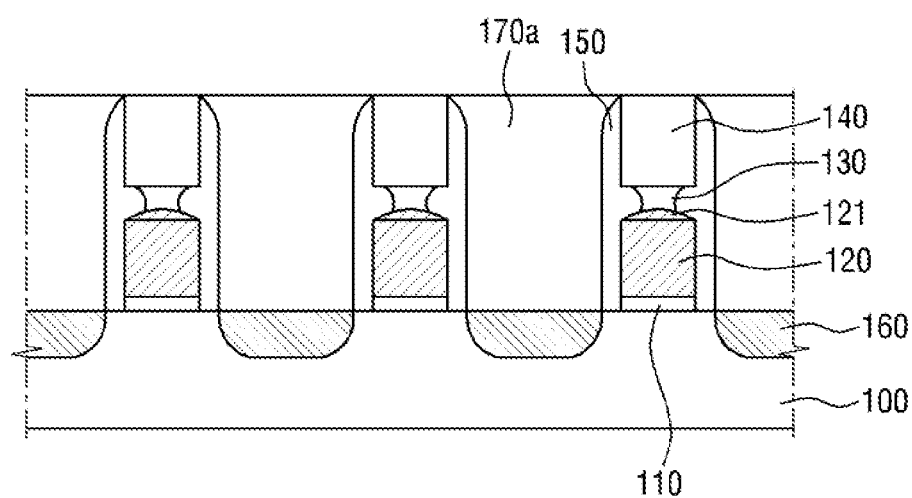

Next, referring to FIG. 8, an interlayer insulation layer 170a is formed on the substrate 100.

The interlayer insulation layer 170a disposed on the substrate 100 may surround the gate spacer 150. In the present embodiment, the interlayer insulation layer 170a is not formed on the dummy gate mask 140, but aspects of the present disclosure are not limited thereto. Therefore, the interlayer insulation layer 170a may be formed to cover the top surfaces of both of the gate spacer 150 and the dummy gate mask 140.

The interlayer insulation layer 170a may include may include a silicon nitride or a nitride oxide layer. The interlayer insulation layer 170a may include a low-k material low-k material and examples thereof may include flowable oxide (FOX), Tonen silazene (TOSZ), undoped silicate glass (USG), borosilica glass (BSG), phosphosilaca glass (PSG), borophosphor silica glass (BPSG), plasma enhanced tetraethyl orthosilicate (PETEOS), fluoride silicate glass (FSG), high density plasma (HDP) oxide, plasma enhanced oxide (PEOX), flowable CVD (FCVD), or combinations thereof, but not limited thereto.

Figure 9:
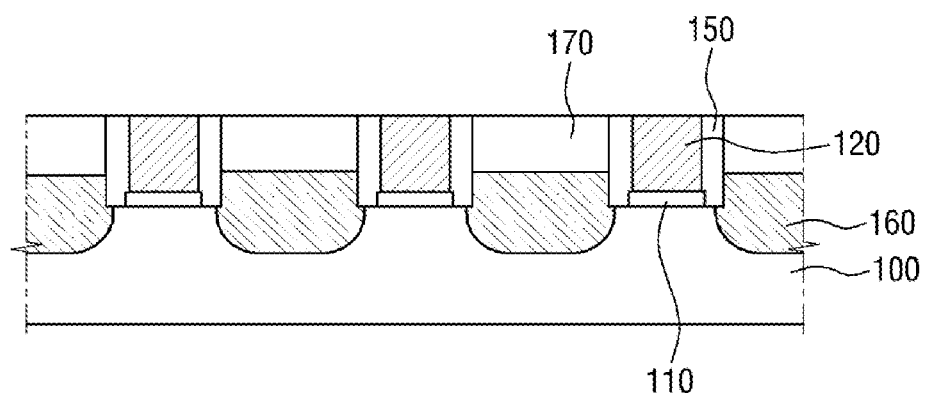

Next, referring to FIG. 9, the dummy gate 120 is planarized to expose the top surface of the dummy gate 120.

An interlayer insulation film 170 may be formed by removing a portion of a interlayer insulation layer disposed on the dummy gate 120 and a portion of the gate spacer 150, the dummy gate mask 140 and the interlayer oxide layer 130 may be removed. The top surface of the dummy gate 120 may be exposed by a chemical mechanical polishing (CMP) process, but aspects of the present disclosure are not limited thereto.

In the present embodiment, during the removing process of the dummy gate mask 140, the interlayer oxide layer 130 may also be removed. Therefore, according to the method for fabricating the semiconductor device of the present embodiment, since a separate process is not required for removing the interlayer oxide layer 130, the semiconductor device can be efficiently fabricated.

Figure 10:
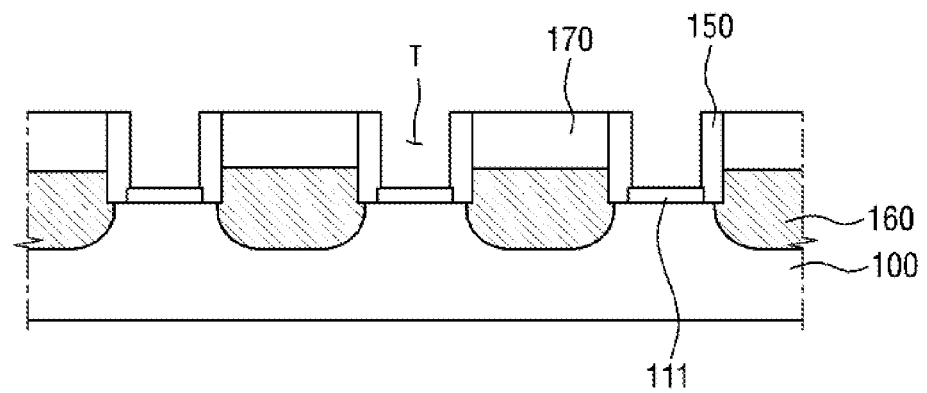

Next, referring to FIG. 10, the dummy gate 120 and the dummy gate insulation layer 110 are removed, thereby forming a gate oxide layer 111.

First, a trench T is formed by removing the dummy gate 120 and the dummy gate insulation layer 110. The top surface of the substrate 100 is exposed in the trench T to then form the gate oxide layer 111.

The gate oxide layer 111 may prevent interface failure between the substrate 100 and the gate insulation layer 124. The gate oxide layer 111 may include a low-k material layer having a dielectric constant (k) of 9 or less, for example, a silicon oxide layer (k≈4) or a silicon oxynitride layer (k≈4~8 according to the concentration of oxygen and nitrogen atoms). Alternatively, the interface layer 111 may include silicate or a combination of layers listed above.

When the dummy gate 120 includes Si, a wet etching process using, for example, ammonia, tetramethyl ammonium hydroxide (TMAH), and/or tetraethylammonium hydroxide (TEAH) may be used as the etching process for removing the dummy gate 120, but aspects of the present disclosure are not limited thereto.

Figure 11:
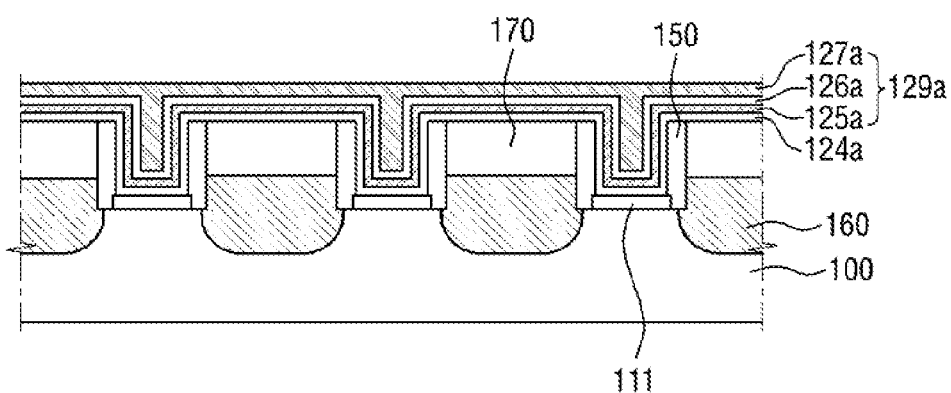

Next, referring to FIG. 11, a gate insulation layer 124*a* and a gate electrode layer 129*a* are sequentially formed on the gate oxide layer 111.

The gate insulation layer 124*a* may include a high-k material having a higher dielectric constant than the gate oxide layer 111. The gate insulation layer 124*a* may include, for example, one material selected from the group consisting of HfSiON, HfO$_2$, ZrO$_2$, Ta$_2$O$_5$, TiO$_2$, SrTiO$_3$, SrTiO$_3$ and BaTiO$_3$. The gate insulation layer 124*a* may be formed to an appropriate thickness according to the type of device to be formed. The gate insulation layer 124*a* may upwardly extend along sidewalls of the gate spacer 150.

The gate electrode layer 129*a* may include a first conductivity type work function control layer 125*a*, a second conductivity type work function control layer 126*a*, and a gate metal structure 127*a*. The first conductivity type work function control layer 125*a* may be conformally formed. When the substrate 100 is a PMOS region, the first conductivity type work function control layer 125*a* controls a work function of a transistor, thereby adjusting operating characteristics of a P-type transistor. The first conductivity type work function control layer 125*a* may include at least one selected from the group consisting of Mo, Pd, Ru, Pt, TiN, WN, TaN, Ir, TaC, RuN, TiAl, TaAlC, TiAlN, and MoN, but aspects of the present disclosure are not limited thereto.

The second conductivity type work function control layer 126*a* may be formed on the first conductivity type work function control layer 125*a*. The second conductivity type is different from the first conductivity type and may include an N type. The second conductivity type work function control layer 126*a* controls a work function of a transistor, thereby adjusting operating characteristics of an N-type transistor. The second conductivity type work function control layer 126*a* may include, for example, TiAl or TiAlN. Even if the second conductivity type work function control layer 126*a* is formed on the first conductivity type work function control layer 125*a*, if the first conductivity type work function control layer 125*a* is positioned under the second conductivity type work function control layer 126*a*, the operating characteristics of a transistor may not be affected by the second conductivity type work function control layer 126*a* but may be affected by the first conductivity type work function control layer 125*a*. Eventually, only the first conductivity type work function control layer 125*a* may control the operating characteristics of a transistor.

Meanwhile, whereas the gate electrode layer 129*a* including both of the first and second conductivity type work function control layers 125*a* and 126*a* is illustrated in FIG. 11, the gate electrode layer 129*a* may include only the first conductivity type work function control layer 125*a*.

The gate metal structure 127*a* may be formed on the second conductivity type work function control layer 126*a*. The gate metal structure 127*a* may include, for example, Al or W, but aspects of the present disclosure are not limited thereto.

Meanwhile, when the substrate 100 includes an NMOS region, the gate electrode layer 129*a* may not include the first conductivity type work function control layer 125*a*. Therefore, the second conductivity type work function control layer 126*a* may allow a gate electrode (129 of FIG. 12) to operate with characteristics of an N-type transistor.

Figure 12:
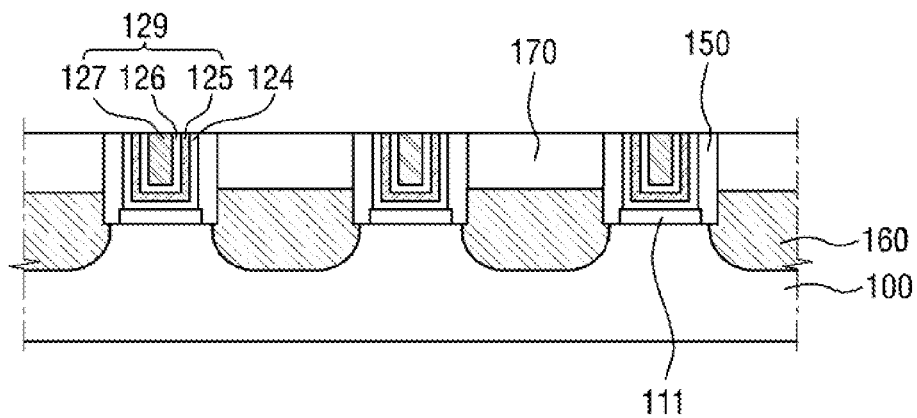

Next, referring to FIG. 12, etching is performed until a top surface of the interlayer insulation layer 170 is exposed, thereby forming a gate electrode 129 and a gate insulation layer 124.

Figure 13:
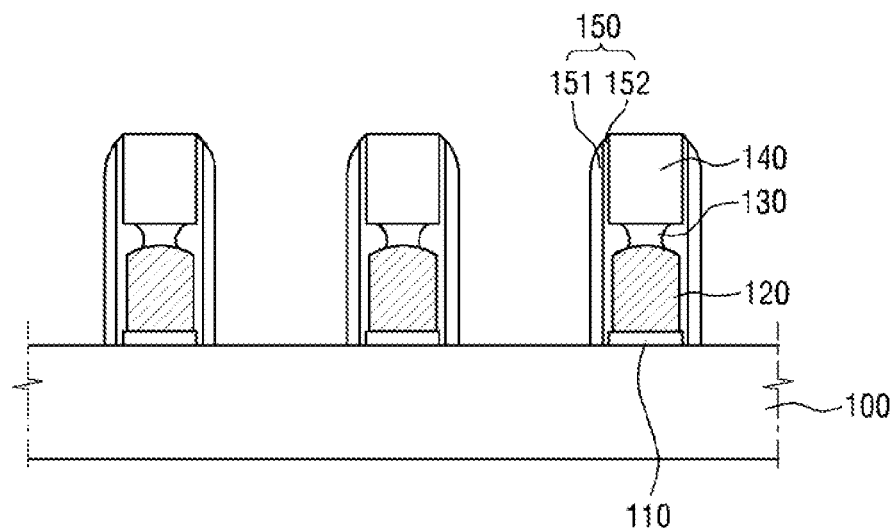
FIG. 13 is a cross-sectional view for reference in describing an intermediate process step in a method for fabricating a semiconductor device according to an embodiment of the present disclosure.

FIG. 13 is a cross-sectional view for reference in describing a method for fabricating the semiconductor device according to a second embodiment of the present disclosure. Since the method for fabricating a semiconductor device according to the present embodiment is substantially the same as the method for fabricating the semiconductor device according to the first embodiment of the present disclosure, except that a gate spacer having multiple layers is formed, the same functional components as those of the first embodiment are denoted by the same reference numerals, descriptions thereof will be briefly given or will not be given.

FIG. 13 illustrates results of an intermediate process step in a method for fabricating a semiconductor device according to a second embodiment of the present disclosure. The intermediate process step of the present embodiment illustrated in FIG. 13 may correspond to the intermediate process step of the first embodiment illustrated in FIG. 6.

Referring to FIG. 13, a gate spacer layer is removed from a top surface of a substrate 100 and a top surface of a dummy gate mask 140, thereby forming a gate spacer 150.

The gate spacer 150 according to the present embodiment includes an internal gate spacer 152 and an external gate spacer 151. The internal gate spacer 152 may be formed to cover the outer surface of the gate spacer 150, that is, sidewalls of the dummy gate 120, the interlayer oxide layer 130 and the dummy gate mask 140. The external gate spacer 151 may be formed to cover the outer surface of the gate spacer 150, that is, the internal gate spacer 152.

The internal gate spacer 152 and the external gate spacer 151 may be made of different materials. In addition, the internal gate spacer 152 may be formed by an atomic layer deposition (ALD) process.

In the present embodiment, sidewalls of the dummy gate 120, the interlayer oxide layer 130 and the dummy gate mask 140 may be covered by the internal gate spacer 152 formed by the ALD process. The internal gate spacer 152 formed by the ALD process may effectively cover the sidewalls of the interlayer oxide layer 130. That is to say, in the present embodiment, the gate spacer 150 including the internal gate spacer 152 and the external gate spacer 151 may serve as a dummy gate protection layer for preventing a nodule defect from being generated in the dummy gate 120.

Figure 14:
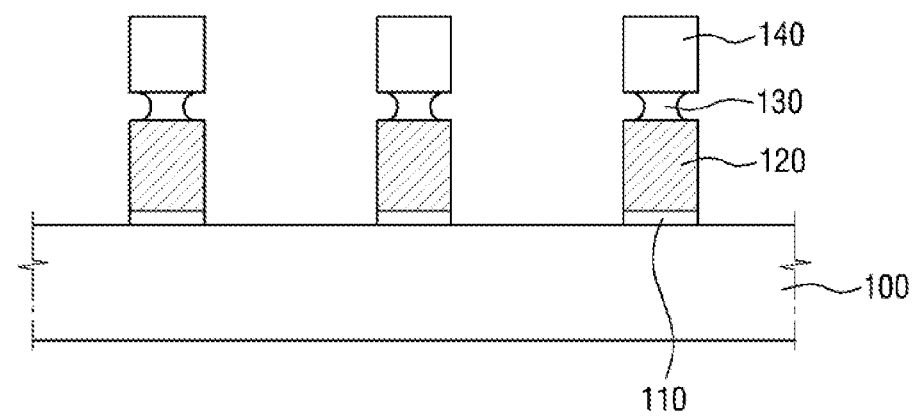
FIG. 14 is a cross-sectional view for reference in describing an intermediate process step in a method for fabricating a semiconductor device according to an embodiment of the present disclosure.

FIG. 14 is a cross-sectional view for reference in describing a method for fabricating a semiconductor device according to a third embodiment of the present disclosure. Since the method for fabricating the semiconductor device according to the present embodiment is substantially the same as the method for fabricating the semiconductor device according to the first embodiment of the present disclosure, except that the step of forming a dummy gate oxide layer is not provided, the same functional components as those of the first embodiment are denoted by the same reference numerals, descriptions thereof will be briefly given or will not be given.

FIG. 14 illustrates results of an intermediate process step in a method for fabricating a semiconductor device according to a third embodiment of the present disclosure. In the present embodiment, the intermediate process step of forming a dummy gate oxide layer (121a of FIG. 3) is not provided, unlike in the first embodiment, and the intermediate process step according to the present embodiment illustrated in FIG. 14 may correspond to the intermediate process step according to the first embodiment illustrated in FIG. 4.

Referring to FIG. 14, after forming the dummy gate oxide layer (121a of FIG. 3) oxidized by thermal oxidation, the step of removing the dummy gate oxide layer is not provided. Therefore, in the intermediate process step illustrated in FIG. 14, only a portion of the interlayer oxide layer 130 is removed.

In the present embodiment, the portion of the interlayer oxide layer 130 is removed, and a region of a gate spacer located to corresponding to the removed portion of the interlayer oxide layer 130 is formed to have a sufficiently large thickness, thereby improving the process reliability of the semiconductor device. In the present embodiment, steps of thermal oxidation and removing the dummy gate oxide layer are not provided, thereby performing the semiconductor device fabricating process rapidly and economically.

Figure 15:
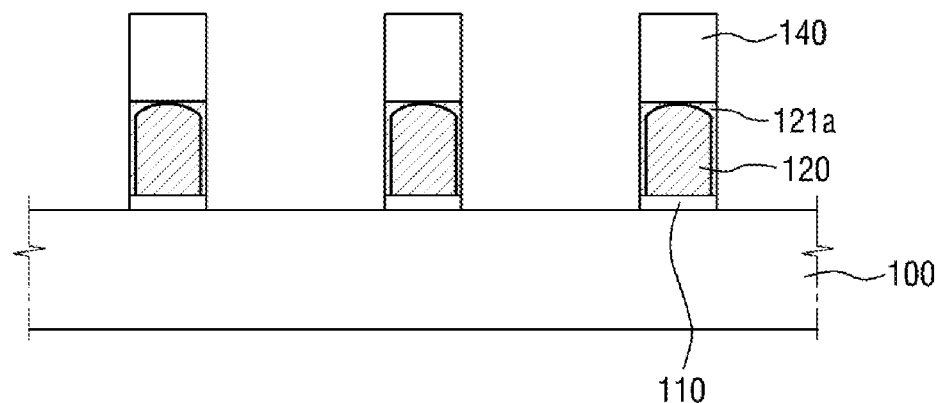
FIGS. 15 and 16 are cross-sectional views for reference in describing a method for fabricating a semiconductor device according to an embodiment of the present disclosure.
Figure 16:
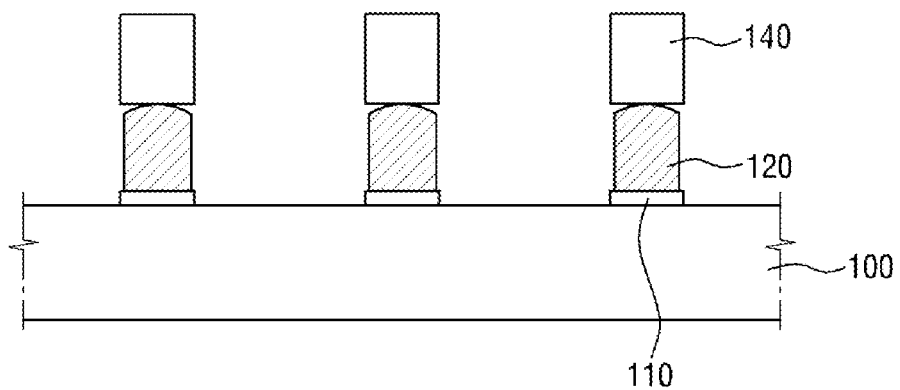

FIGS. 15 and 16 are cross-sectional views for reference in describing a method for fabricating a semiconductor device according to a fourth embodiment of the present disclosure. Since the method for fabricating a semiconductor device according to the present embodiment is substantially the same as the method for fabricating the semiconductor device according to the first embodiment of the present disclosure, except that the step of forming an interlayer oxide layer is not provided, the same functional components as those of the first embodiment are denoted by the same reference numerals, descriptions thereof will be briefly given or will not be given.

FIGS. 15 and 16 illustrate results of intermediate process steps in the method for fabricating a semiconductor device according to a fourth embodiment of the present disclosure. Compared to the first embodiment, the intermediate process steps of the present embodiment illustrated in FIGS. 15 and 16 may correspond to the intermediate process steps illustrated in FIGS. 3 and 4.

Referring to FIGS. 15 and 16, a dummy gate mask 140 is directly formed on a dummy gate 120 without forming an interlayer oxide layer (130 of FIG. 3).

Next, a dummy gate oxide layer 121a is formed on top and side portions of the dummy gate 120 through thermal oxidation. Next, the dummy gate oxide layer 121a is removed through a removing process, including wet etching, and the dummy gate 120 is exposed. In the same manner as the first embodiment, a gate spacer, covering sidewalls of the dummy gate 120 and the dummy gate mask 140, may be formed in subsequent process steps.

In the present embodiment, the dummy gate oxide layer 121a is removed. However, the dummy gate oxide layer 121a may not be removed. In this case, the gate spacer may cover the sidewalls of the dummy gate oxide layer 121a and the dummy gate mask 140. Even when the dummy gate oxide layer 121a remains without being removed, the gate spacer covering the sidewalls of the dummy gate oxide layer 121a and the dummy gate mask 140 may prevent a nodule defect from being generated in the dummy gate 120. In this case, the gate spacer and the dummy gate oxide layer 121a may serve as a dummy gate protection layer for preventing a nodule defect from being generated in the dummy gate 120.

Figure 17:
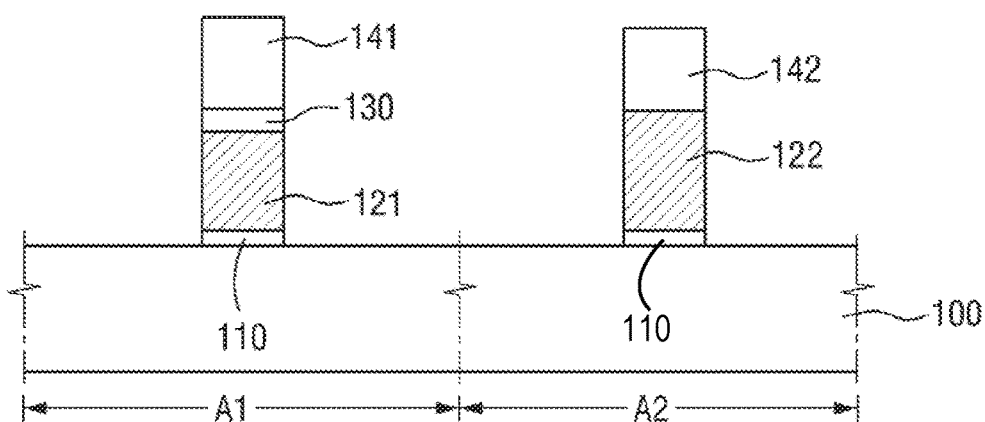
FIG. 17 is a cross-sectional view for reference in describing a method for fabricating a semiconductor device according to an embodiment of the present disclosure.

FIG. 17 is a cross-sectional view for reference in describing a method for fabricating a semiconductor device according to a fifth embodiment of the present disclosure.

Referring to FIG. 17, a substrate 100 includes a first region A1 and a second region A2. A dummy gate insulation layer 110, a first dummy gate 121, an interlayer oxide layer 130 and a first dummy gate mask 141 are sequentially stacked on the substrate 100 of the first region A1. The dummy gate insulation layer 110, a second dummy gate 122 and a second dummy gate mask 142 are sequentially stacked on the substrate 100 of the second region A2.

One of the semiconductor device fabricating methods according to the first to third embodiments may be applied to the first region A1, and the semiconductor device fabricating method according to the fourth embodiment may be applied to the second region A2. That is to say, in the present embodiment, semiconductor devices may be fabricated using different fabricating methods in different regions of the substrate 100. Accordingly, different types of semiconductor devices having various configurations may be formed on the substrate 100 according to the objects and necessity of the disclosure. Different types of semiconductor devices fabricated by the semiconductor device fabricating methods according to the embodiments of the present disclosure may have different heights, widths and/or volumes, but aspects of the present disclosure are not limited thereto.

Since the semiconductor device fabricating methods according to the first to fourth embodiments of the present disclosure have been described above, descriptions thereof will not be repeated.

Figure 18:
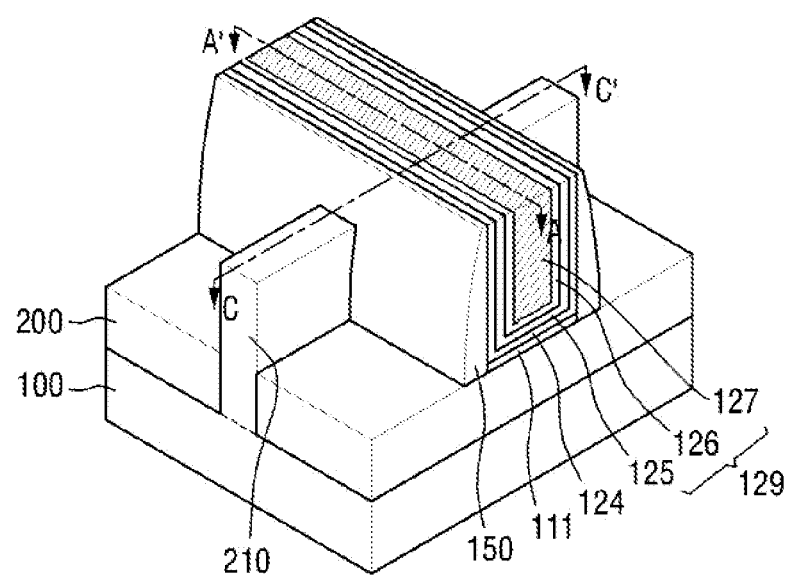
FIGS. 18, 19 and 20 are a perspective view and cross-sectional views for reference in describing a method for fabricating a semiconductor device according to an embodiment of the present disclosure.
Figure 19:
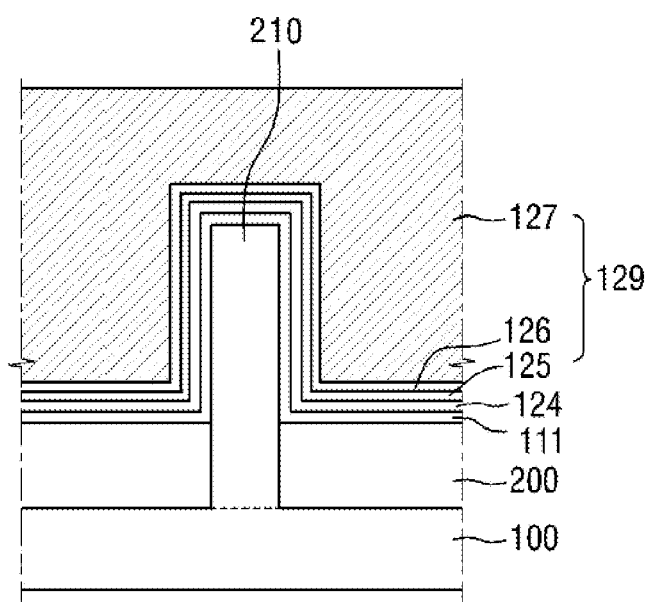
Figure 20:
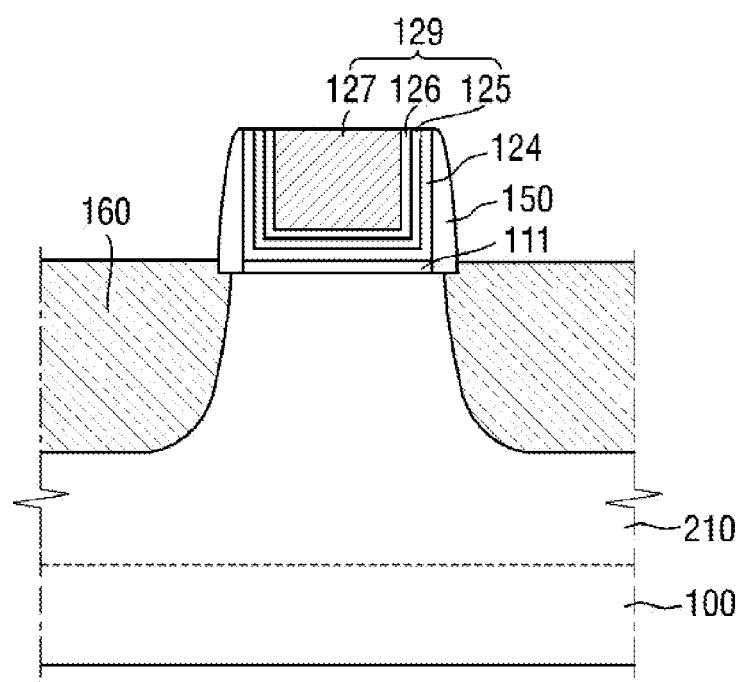

FIG. 18 is a perspective view and FIGS. 19 and 20 are cross-sectional views for reference in describing a method for fabricating a semiconductor device according to a sixth embodiment of the present disclosure. Specifically, FIG. 18 is a perspective view of a semiconductor device according to a sixth embodiment of the present disclosure, FIG. 19 is a cross-sectional view taken along the line A-A' of FIG. 18, and FIG. 20 is a cross-sectional view taken along the line C-C' of FIG. 18. Since the method for fabricating a semiconductor device according to the present embodiment is substantially the same as the method for fabricating the semiconductor device according to the first embodiment of the present disclosure, except that a fin 210 and a device isolation layer 200 are formed on a substrate 100, the same functional components as those of the first embodiment are denoted by the same reference numerals, descriptions thereof will be briefly given or will not be given.

Referring to FIGS. 18 to 20, the fin 210 and the device isolation layer 200 are formed on the substrate 100.

The device isolation layer 200 formed on the substrate 100 is used for device isolation. The device isolation layer 200 is an insulation layer, which may be a high density plasma (HDP) oxide layer, a silicon on glass (SOG) oxide layer, or a chemical vapor deposition (CVD) oxide layer, but not limited thereto.

The fin 210 is formed to protrude on the substrate 100. The fin 210 may extend lengthwise in a direction Y1. The fin 210 may be a portion of the substrate 100. The device isolation layer 200 may cover a top surface of the substrate 100 and portions of side surfaces of the fin 210.

The semiconductor device may be fabricated on the substrate 100 having the fin 210 and the device isolation layer 200 formed thereon by the aforementioned semiconductor device fabricating methods according to the embodiments of the present disclosure.

The semiconductor device fabricating methods according to the present disclosure have been described through the first to sixth embodiments. Each of the first to sixth embodiments may be an independent disclosure and technical features of each of the first to sixth embodiments can be applied to other embodiments within the allowable scope of inventive concepts.

Figure 21:
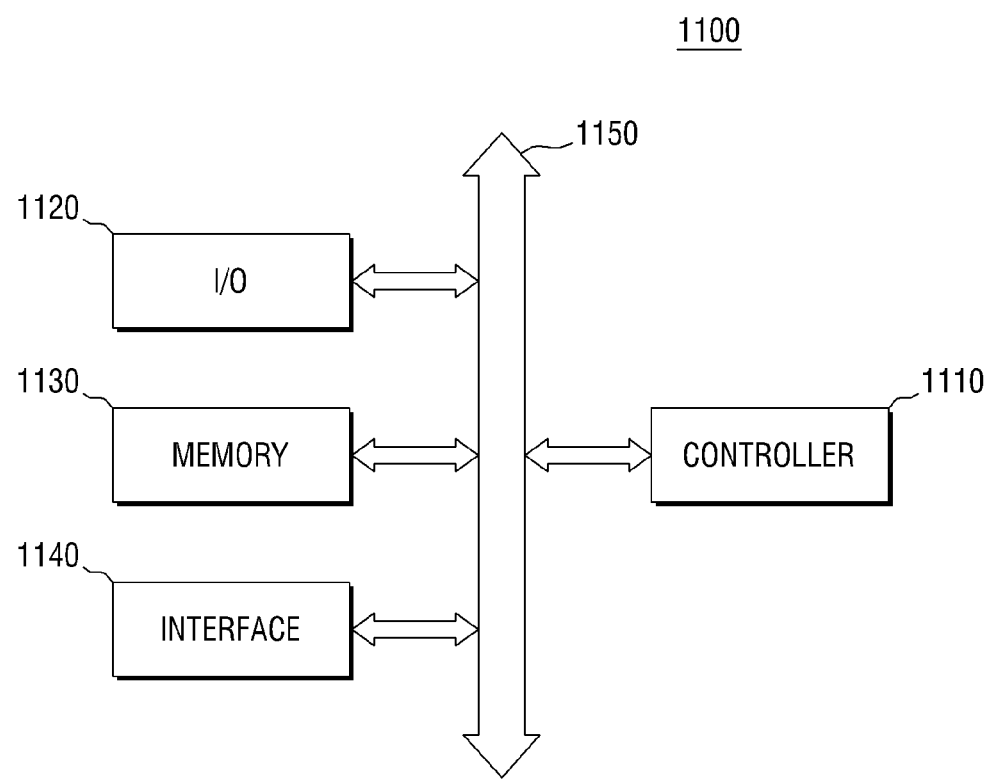
FIG. 21 is a block diagram of an electronic system including a semiconductor device according to one or more embodiments of the present disclosure.

FIG. 21 is a block diagram of an electronic system including a semiconductor device according to one or more embodiments of the present disclosure.

Referring to FIG. 21, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1110 may further include high-speed DRAM and/or SRAM as a working memory for improving the operation of the controller 1110. The semiconductor device fabricated by the semiconductor device fabricating methods according to some embodiments of the present disclosure may be employed as the working memory. In addition, the semiconductor device may be provided in the memory device 1130 or may be provided as some components of the controller 1290 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

The electronic system 1100 may be applied to any one of a personal digital assistant (PDA), a portable computer, a web tablet, a wireless phone, a mobile phone, a digital music player, a memory card, or any type of electronic device capable of transmitting and/or receiving information in a wireless environment.

Figure 22:
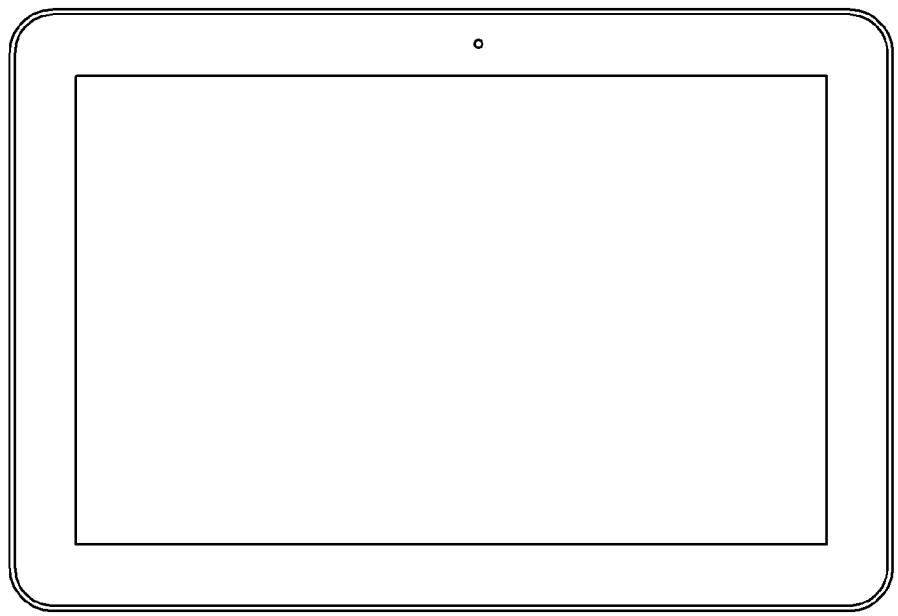
FIGS. 22, 23 and 24 illustrate exemplary semiconductor systems which may include a semiconductor device fabricated methods according to one or more embodiments of the present disclosure.
Figure 23:
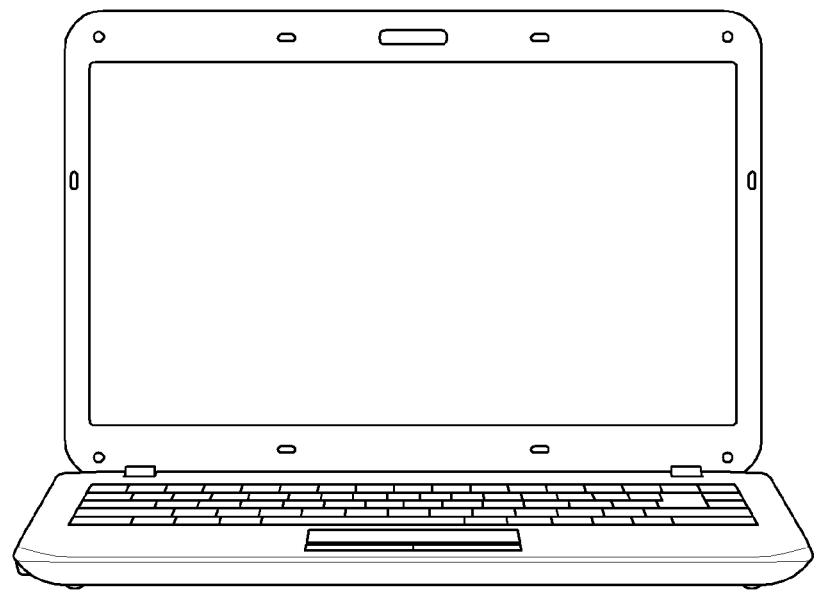
Figure 24:
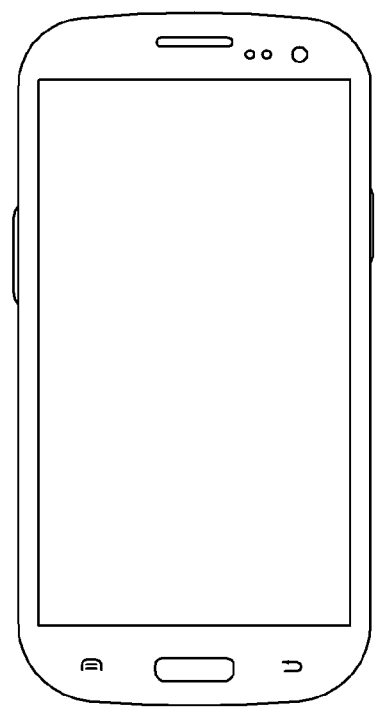

FIGS. 22 to 24 illustrate exemplary semiconductor systems to which semiconductor devices fabricated by methods according to one or more embodiments of the present disclosure can be applied.

FIG. 22 illustrates an example in which a semiconductor device according to an embodiment of the present disclosure is applied to a tablet PC (1200), FIG. 23 illustrates an example in which a semiconductor device according to an embodiment of the present disclosure is applied to a notebook computer (1300), and FIG. 24 illustrates an example in which a semiconductor device according to an embodiment of the present disclosure is applied to a smart phone (1400).

The semiconductor devices fabricated by semiconductor device fabricating methods according to some embodiments of the present disclosure may be applied to the tablet PC 1200, the notebook computer 1300, and the smart phone 1400. In addition, it is obvious to one skilled in the art that the semiconductor devices fabricated by semiconductor device fabricating methods according to some embodiments of the present disclosure may also be applied to other IC devices not illustrated herein. That is to say, in the illustrated embodiments, only the tablet PC 1200, the notebook computer 1300, and the smart phone 1400 are exemplified as exemplary semiconductor systems, but aspects of the present disclosure are not limited thereto. In some embodiments of the present disclosure, the semiconductor system may be implemented as a computer, an ultra mobile personal computer (UMPC), a work station, a net-book, a personal digital assistant (PDA), a portable computer, a wireless phone, a mobile phone, an e-book, a portable multimedia player (PMP), a portable game console, a navigation device, a black box, a digital camera, a 3-dimensional television, a digital audio recorder, a digital audio player, a digital picture recorder, a digital picture player, digital video recorder, a digital video player, or the like.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the disclosure.

What is claimed is:

1. A method for fabricating a semiconductor device, the method comprising:
   forming a dummy gate on a substrate;
   forming a dummy gate mask on the dummy gate;
   forming a gate spacer on the substrate, the gate spacer covering at least one sidewall surface of the dummy gate and the dummy gate mask;
   forming a recess on at least one side of the dummy gate by removing a portion of the substrate;
   forming an epitaxial layer in the recess using an epitaxial growth process; and
   forming a dummy gate oxide layer on a portion of a top surface of the dummy gate and at least a portion of side surfaces of the dummy gate before forming the gate spacer,
   wherein the forming of the dummy gate mask comprises forming an interlayer oxide layer and a dummy gate mask layer on the dummy gate.

2. The method of claim 1, wherein the interlayer oxide layer is formed by a chemical vapor deposition process before forming the dummy gate mask.

3. The method of claim 1, wherein the forming of the dummy gate oxide layer comprises forming the dummy gate oxide layer through thermal oxidation.

4. The method of claim 1, further comprising removing a portion of the interlayer oxide layer and the dummy gate oxide layer.

5. The method of claim 4, wherein the forming of the gate spacer comprises forming an internal gate spacer and an external gate spacer covering the internal gate spacer, wherein the internal gate spacer and the external gate spacer are made of different materials.

6. The method of claim 5, wherein the forming of the internal gate spacer comprises forming the internal gate spacer using an atomic layer deposition (ALD) process.

7. The method of claim 1, further comprising, before the forming of the gate spacer, exposing the dummy gate by removing the dummy gate oxide layer.

8. The method of claim 1, wherein the forming of the dummy gate on the substrate comprises forming a fin on the substrate and forming the dummy gate on the fin.

9. A method for fabricating a semiconductor device, the method comprising:
- preparing a substrate including a first region and a second region;
- sequentially stacking a first dummy gate, an interlayer oxide layer, and a first dummy gate mask on the first region;
- sequentially stacking a second dummy gate and a second dummy gate mask on the second region;
- forming a dummy gate oxide layer on at least one of the first dummy gate and the second dummy gate;
- forming a first gate spacer covering at least first side surfaces of the first dummy gate, the interlayer oxide layer and the first dummy gate mask on the first region;
- forming a second gate spacer covering at least first side surfaces of the second dummy gate and the second dummy gate mask;
- forming a recess on at least one side of the first dummy gate and the second dummy gate by etching the substrate;
- forming an epitaxial layer in the recess through epitaxial growth; and
- before the forming of the first and second gate spacers, removing at least a portion of the interlayer oxide layer, wherein after the removing a width of the interlayer oxide layer is less than a width of the first dummy gate.

10. The method of claim 9, wherein the forming of the dummy gate oxide layer comprises forming the dummy gate oxide layer by performing thermal oxidation on portions of top surfaces of the first dummy gate and the second dummy gate and at least a portion of side surfaces of the first dummy gate and the second dummy gate.

11. The method of claim 9, wherein at least one of the forming of the first gate spacer and the forming of the second gate spacer comprises forming an internal gate spacer and an external gate spacer covering the internal gate spacer, wherein the internal gate spacer and the external gate spacer are made of different materials.

12. The method of claim 11, wherein the forming of the internal gate spacer comprises forming the internal gate spacer using an atomic layer deposition (ALD) process.

13. A method for fabricating a semiconductor device, the method comprising:
- forming a dummy gate on a substrate;
- forming an interlayer oxide layer on the dummy gate;
- forming a dummy gate mask on the interlayer oxide layer;
- forming a gate spacer layer covering the substrate;
- forming a gate spacer on sidewalls of the dummy gate, the interlayer oxide layer and the dummy gate mask by removing a portion of the gate spacer layer formed on the substrate;
- forming a recess by etching the substrate on at least one side of the dummy gate;
- forming an epitaxial layer in the recess through epitaxial growth;
- forming an interlayer insulation layer covering the epitaxial layer and the gate spacer;
- performing a planarization process to expose the dummy gate; and
- removing the dummy gate and then forming an upwardly extending gate insulation layer on a region from which the dummy gate is removed along sidewalls of the gate spacer and forming a gate electrode on the gate insulation layer.

14. The method of claim 13, further comprising forming a dummy gate oxide layer on a portion of a top surface of the dummy gate and at least a portion of side surfaces of the dummy gate through thermal oxidation before forming the gate spacer layer.

15. The method of claim 14, further comprising removing a portion of the interlayer oxide layer and the dummy gate oxide layer.

16. The method of claim 13, wherein the forming of the gate spacer comprises forming an internal gate spacer and an external gate spacer covering the internal gate spacer, wherein the internal gate spacer is formed using an atomic layer deposition (ALD) process.

* * * * *